(12) United States Patent
Hong

(10) Patent No.: US 10,882,793 B2
(45) Date of Patent: Jan. 5, 2021

(54) FERRITE SHEET PRODUCTION METHOD AND FERRITE SHEET USING SAME

(71) Applicant: AMOTECH CO., LTD., Incheon (KR)

(72) Inventor: Kyung Pyo Hong, Gyeonggi-do (KR)

(73) Assignee: AMOTECH CO., LTD., Incheon (KR)

( * ) Notice: Subject to any disclaimer, the term of this patent is extended or adjusted under 35 U.S.C. 154(b) by 0 days.

(21) Appl. No.: 15/775,288

(22) PCT Filed: Nov. 11, 2016

(86) PCT No.: PCT/KR2016/012974
§ 371 (c)(1),
(2) Date: May 10, 2018

(87) PCT Pub. No.: WO2017/082662
PCT Pub. Date: May 18, 2017

(65) Prior Publication Data
US 2018/0327315 A1 Nov. 15, 2018

(30) Foreign Application Priority Data
Nov. 11, 2015 (KR) .................. 10-2015-0158409

(51) Int. Cl.
*B32B 3/30* (2006.01)
*C04B 35/26* (2006.01)
(Continued)

(52) U.S. Cl.
CPC .............. *C04B 35/26* (2013.01); *B32B 18/00* (2013.01); *C04B 35/64* (2013.01); *H01F 3/08* (2013.01);
(Continued)

(58) Field of Classification Search
None
See application file for complete search history.

(56) References Cited

FOREIGN PATENT DOCUMENTS

KR 1019980028021 7/1998
KR 101283671 7/2013
(Continued)

OTHER PUBLICATIONS

International Search Report and Written Opinion Issued in Corresponding PCT Application. No. PCT/KR2016/012974, dated Mar. 14, 2017.
(Continued)

*Primary Examiner* — Seth Dumbris
*Assistant Examiner* — Kim S Horger
(74) *Attorney, Agent, or Firm* — Norton Rose Fulbright US LLP

(57) ABSTRACT

A ferrite sheet manufacturing method according to the present invention includes (1) stacking a plurality of molded ferrite sheets to prepare a ferrite stack having gas discharge passages between adjacent molded ferrite sheets, and (2) sintering the ferrite stack. According to the present invention, productivity can be increased, and manufacturing costs can be reduced. In addition, a gas generated during combustion of a binder can be discharged using a gas discharge passage between repeatedly uneven portions disposed in one direction, thereby preventing wrinkles or waviness generated in a peripheral portion of a ferrite sheet. Furthermore, since it is possible to improve durability and reliability of an electromagnetic wave shielding material manufactured using the ferrite sheet, the ferrite sheet can be applied to various electronic products.

3 Claims, 9 Drawing Sheets

(51) Int. Cl.
- *H05K 9/00* (2006.01)
- *B32B 18/00* (2006.01)
- *H01F 3/08* (2006.01)
- *H01F 41/02* (2006.01)
- *C04B 35/64* (2006.01)

(52) U.S. Cl.
CPC ..... *H01F 41/0233* (2013.01); *H01F 41/0246* (2013.01); *H05K 9/0081* (2013.01); *H05K 9/0088* (2013.01); *C04B 2235/604* (2013.01); *C04B 2235/963* (2013.01); *C04B 2237/34* (2013.01); *C04B 2237/62* (2013.01)

(56) References Cited

FOREIGN PATENT DOCUMENTS

| | | | |
|---|---|---|---|
| KR | 20140073393 | 6/2014 | |
| KR | 20140076311 A * | 6/2014 | |
| KR | 101474212 | 12/2014 | |
| KR | 20150029282 | 3/2015 | |
| KR | 20150029282 A * | 3/2015 | |
| KR | 20160072396 A * | 6/2016 | ............. C04B 35/36 |
| WO | WO 2016093587 | 6/2016 | |
| WO | WO-2016093587 A1 * | 6/2016 | ............. C04B 35/26 |

OTHER PUBLICATIONS

Signed Declaration of Kyung Pyo Hong Under 37 C.F.R. §1.132 filed in U.S. Appl. No. 15/775,288.

* cited by examiner

FERRITE SHEET PRODUCTION METHOD AND FERRITE SHEET USING SAME

CROSS-REFERENCE TO RELATED APPLICATIONS

This application is a national phase application under 35 U.S.C. § 371 of International Application No. PCT/KR2016/012974, filed Nov. 11, 2016, which claims priority to and the benefit of Korean Patent Application No. 10-2015-0158409, filed on Nov. 11, 2015. The contents of each of the referenced applications are incorporated into the present application by the reference.

FIELD OF THE DISCLOSURE

The present invention relates to method for manufacturing a ferrite sheet and a ferrite sheet manufactured using the same, and more particularly, to a ferrite sheet manufacturing method capable of providing gas passages from repeatedly uneven portions on a surface of a ferrite sheet disposed in one direction, and a ferrite sheet manufactured using the same.

DESCRIPTION OF RELATED ART

Recently, electronic products have become multifunctional, smaller, and been operated at higher speeds in order to improve portability, convenience, and the like. Such a trend makes an electronic circuit more complex, and a signal has become higher in frequency for processing a large amount of data. The complexity and high frequency of electronic products generate electromagnetic waves. The generated electromagnetic waves cause malfunction and damage of surrounding electronic products. In addition, the electromagnetic waves have a bad influence on a human body, thereby having international limits of generation amounts.

Therefore, an electromagnetic wave shielding material is used to prevent malfunction of electronic products, caused by electromagnetic waves generated in the electronic products and external electromagnetic waves. A ferrite sheet is mainly used as the electromagnetic wave shielding material. The ferrite sheet is manufactured by mixing a ferrite powder with a binder or the like, molding the resultant mixture into a molded ferrite sheet, and then, sintering the molded ferrite sheet. As the related art related to this, related art document 1 discloses an electromagnetic wave absorber, a method of manufacturing the same, and an application of the same.

A protective film and an adhesive tape are each bonded to both surfaces of the ferrite sheet, and thus, the ferrite sheet is used as the electromagnetic wave shielding material. Conventionally, in order to secure productivity during sintering of ferrite sheets, the ferrite sheets had been manufactured by stacking and sintering molded ferrite sheets. The ferrite sheets manufactured through stacking and sintering are manually separated, and in this case, the sintered ferrite sheets have been frequently damaged. In addition, since heat may not be uniformly transferred on an entire surface of the ferrite sheets manufactured by such a ferrite sheet manufacturing method, quality of the ferrite sheets may become degraded.

Particularly, a binder combustion gas, which is generated during a sintering process of molded ferrite sheets after the molded ferrites sheets are stacked, may not be easily discharged to generate wrinkles or waviness of ferrite sheets, resulting in a quality difference between the ferrite sheets. Therefore, there is an urgent need to develop a technology for overcoming such a problem.

SUMMARY OF THE INVENTION

The present invention has been made in consideration of the above situation, and is directed to providing a ferrite sheet manufacturing method capable of preventing generation of wrinkles or waviness of ferrite sheets caused by a gas generated during combustion of a binder, and concurrently, minimizing damage during separation of the ferrite sheets, and a transfer base material for manufacturing a ferrite sheet.

In addition, the present invention is directed to providing a ferrite sheet manufactured using the ferrite sheet manufacturing method, which is capable of improving durability and reliability of an electromagnetic wave shielding material.

One aspect of the present invention provides a method for manufacturing a ferrite sheet including (1) stacking a plurality of molded ferrite sheets to prepare a ferrite stack having gas discharge passages between adjacent molded ferrite sheets, and (2) sintering the ferrite stack.

Operation (1) may include: (1-1) preparing the molded ferrite sheets; (1-2) bringing each of the molded ferrite sheets into contact with a transfer base material having repeatedly uneven portions on a surface thereof disposed in one direction, and then, pressing each of the molded ferrite sheets and the transfer base material to transfer a reverse image of the uneven portions onto a surface of each of the molded ferrite sheets and to form gas discharge passages; and (1-3) stacking the plurality of molded ferrite sheets to prepare the ferrite stack.

The reverse image of the uneven portions may have ridges and valleys which are alternately formed from one edge to an edge facing the one edge of the molded ferrite sheet, and the ridges and the valleys may extend in a direction in which the other two edges face each other.

A carrier material may be further provided on a surface opposite to a pressurized surface of the molded ferrite sheet.

The transfer base material may be formed by forming paper or a film into a rolled shape and the film may be coated with at least one polymer selected from the group consisting of polyethylene terephthalate (PET), polyimide (PI), polyethylene (PE), polypropylene (PP), and polycarbonate (PC).

The transfer base material may be a flat plate having uneven portions on one surface thereof or may be a roller having uneven portions on an outer surface thereof.

A vertical section of each of the uneven portions may have a polygonal shape or an arc shape with respect to the reverse image of the uneven portions transferred onto the molded ferrite sheet.

When the transfer base material is the flat plate having the uneven portions on one surface thereof, the transfer base material may be brought into contact with an upper surface of the ferrite sheet, and then, the ferrite sheet and the transfer base material may be pressed in a direction perpendicular thereto to transfer a reverse image of the uneven portions on the surface of the ferrite sheet.

When the transfer base material is the roller having the uneven portions on the outer surface thereof, the transfer base material may be brought into contact with an upper surface of the ferrite sheet, and then, the roller may be rolled to form a reverse image of the uneven portions on the surface of the ferrite sheet.

A width to height ratio of a cross section of each of the uneven portions may be in a range of 1:0.2 to 1:1.

Each of the uneven portions may have an average width of 0.5 μm to 500 μm and an average height of 0.5 μm to 100 μm.

The pressing may be performed at a pressure of 10 Mpa to 100 Mpa.

Another aspect of the present invention provides a ferrite sheet including uneven portions on at least one surface thereof so as to provide gas discharge passages, the uneven portions each having a vertical section which has a polygonal shape or an arc shape, wherein a width to height ratio of a cross section of each of the uneven portions is in a range of 1:0.2 to 1:1, an average width of each of the uneven portions is in a range of 0.5 μm to 500 μm, and an average height of each of the uneven portions is in a range of 0.5 μm to 100 μm.

The ferrite sheet may have an average roughness of 0.8 μm to 20 μm.

Another aspect of the present invention provides a transfer base material for manufacturing a ferrite sheet, the transfer base material including uneven portions which have ridges and valleys alternately formed from one edge to an edge facing the one edge of the transfer base material, wherein the ridges and the valleys extend in a direction in which the other two edges face each other.

A width to height ratio of a cross section of each of the uneven portions may be in a range of 1:0.2 to 1:1.

Each of the uneven portions may have an average width of 0.5 μm to 500 μm and an average height of 0.5 μm to 100 μm.

According to the present invention, a method for manufacturing a ferrite sheet can be simplified to increase productivity and reduce manufacturing costs. In addition, a gas generated during combustion of a binder can be discharged using gas discharge passages between repeatedly uneven portions repeated disposed in one direction, thereby preventing wrinkles or waviness generated in a peripheral portion of a ferrite sheet. Furthermore, since it is possible to improve durability and reliability of an electromagnetic wave shielding material manufactured using the ferrite sheet, the ferrite sheet can be applied to various electronic products.

BRIEF DESCRIPTION OF THE DRAWINGS

FIG. 10A is an image showing a ferrite sheet having a value outside of a numerical range of the present invention, and FIG. 10B is an image showing a ferrite sheet having a value within the numerical range of the present invention.

FIG. 11A is a graph showing a ferrite sheet having a value outside of a numerical range of the present invention, and FIG. 11B is a graph showing a ferrite sheet having a value within the numerical range of the present invention.

DETAILED DESCRIPTION OF THE INVENTION

Figure 1:
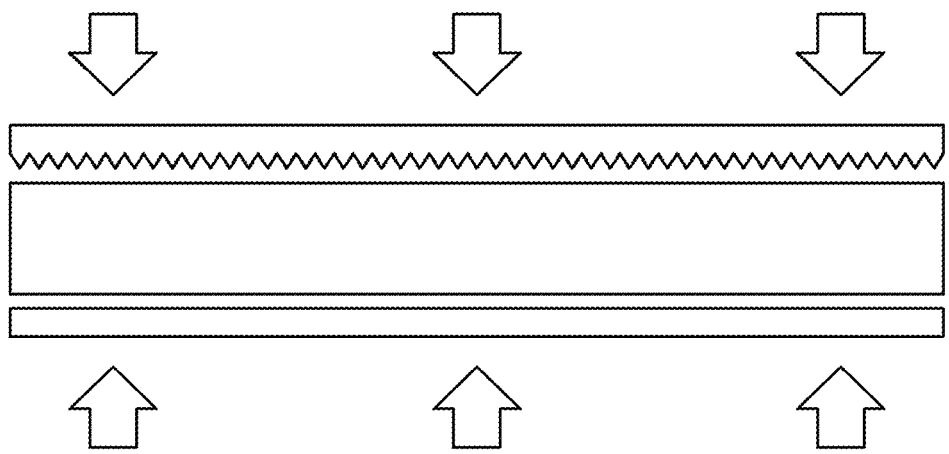
FIG. 1 is a schematic view illustrating a ferrite sheet manufacturing method using a flat plate having uneven portions on one surface thereof as a transfer base material according to an exemplary embodiment of the present invention.

Hereinafter, exemplary embodiments of the present invention will be described in detail with reference to the accompanying drawings so as to be easily practiced by a person of ordinary skill in the art. However, the present invention may be achieved in various different ways and is not limited to the exemplary embodiments described herein. Any redundant descriptions of well-known parts will be omitted in drawings for clarity, and like reference numerals refer to like elements throughout the specification.

A method for manufacturing a ferrite sheet according to the present invention includes (1) stacking a plurality of molded ferrite sheets to prepare a ferrite stack having gas discharge passages between adjacent molded ferrite sheets, and (2) sintering the plurality of stacked molded ferrite sheets.

Meanwhile, in order to increase manufacturing yield and productivity of ferrite sheets, molded ferrite sheets are not separately sintered, and after the molded ferrite sheets are stacked, a sintering process is performed on the molded ferrite sheets. A binder is combusted to essentially generate a combustion gas in the sintering process. In this case, since the binder combustion gas is not easily discharged from closely stacked molded ferrites, the binder combustion gas may remain in the form of a gas in inner spaces between the stacked molded ferrites and thus may cause wrinkles or waviness of ferrite sheets after the sintering process.

That is, unlike the original purpose of performing stacking and sintering processes in order to increase the manufacturing yield and productivity of ferrite sheets, due to a discharge failure of the binder combustion gas generated in the stacking and sintering processes, a desired yield may be difficult to expect, and a processing issue of lowering productivity may rather occur.

Thus, the present invention provides the ferrite sheet manufacturing method capable of solving a discharge failure of a binder combustion gas in a subsequent sintering process by bringing a molded ferrite sheet into contact with a transfer base material having repeatedly uneven portions on a surface thereof disposed in one direction, pressing the molded ferrite sheet and the transfer base material to transfer a reverse image of the uneven portions onto a surface of the molded ferrite sheet and to form gas discharge passages, and then, stacking the molded ferrite sheets in which the gas discharge passages are formed.

Operation (1) may include: (1-1) preparing the molded ferrite sheets; (1-2) bringing each of the molded ferrite sheets into contact with a transfer base material having repeatedly uneven portions on a surface thereof disposed in one direction, and then, pressing each of the molded ferrite sheets and the transfer base material to transfer a reverse image of the uneven portions onto a surface of each of the molded ferrite sheets and to form the gas discharge passages; and (1-3) stacking the plurality of molded ferrite sheets to prepare the ferrite stack.

The molded ferrite sheets to be stacked in operation (1-1) are in a state yet to be stacked and sintered, and in order to easily form uneven portions on the surface of the molded ferrite sheets, a known pre-treatment process may be performed without limitation within a range not affecting magnetic properties of the ferrite.

Figure 9:
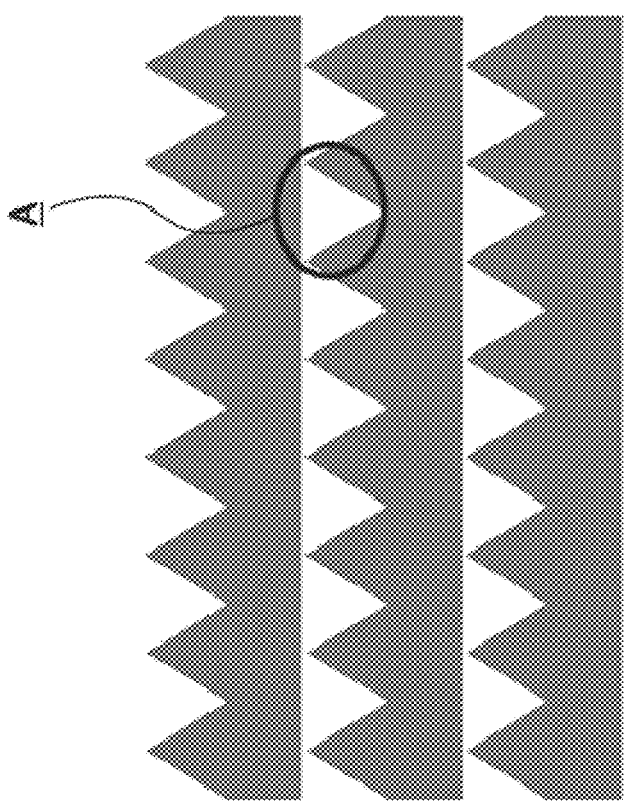
FIG. 9 is a schematic view illustrating a side portion of a ferrite sheet stack having gas discharge passages according to an exemplary embodiment of the present invention.

Next, operation (1-2) is an operation of forming the uneven portions on the molded ferrite sheet to provide the gas discharge passages. The transfer base material for forming the uneven portions on the molded ferrite sheet may be a flat plate having uneven portions on one surface thereof or may be a roller having uneven portions on an outer surface thereof. The uneven portions may have ridges and valleys which are alternately formed from one edge to an edge facing the one edge of the molded ferrite sheet. The ridges and the valleys may extend in a direction in which the other two edges face each other. In the ferrite stack having the uneven portions as formed above, as shown in FIG. 9, a binder combustion gas generated in a sintering process can be easily discharged through a gap (region A) formed between uneven portions provided on one molded ferrite sheet and a molded ferrite sheet on an upper portion of the uneven portions, thereby preventing processing issues such as the aforementioned wrinkles or waviness.

Figure 4:
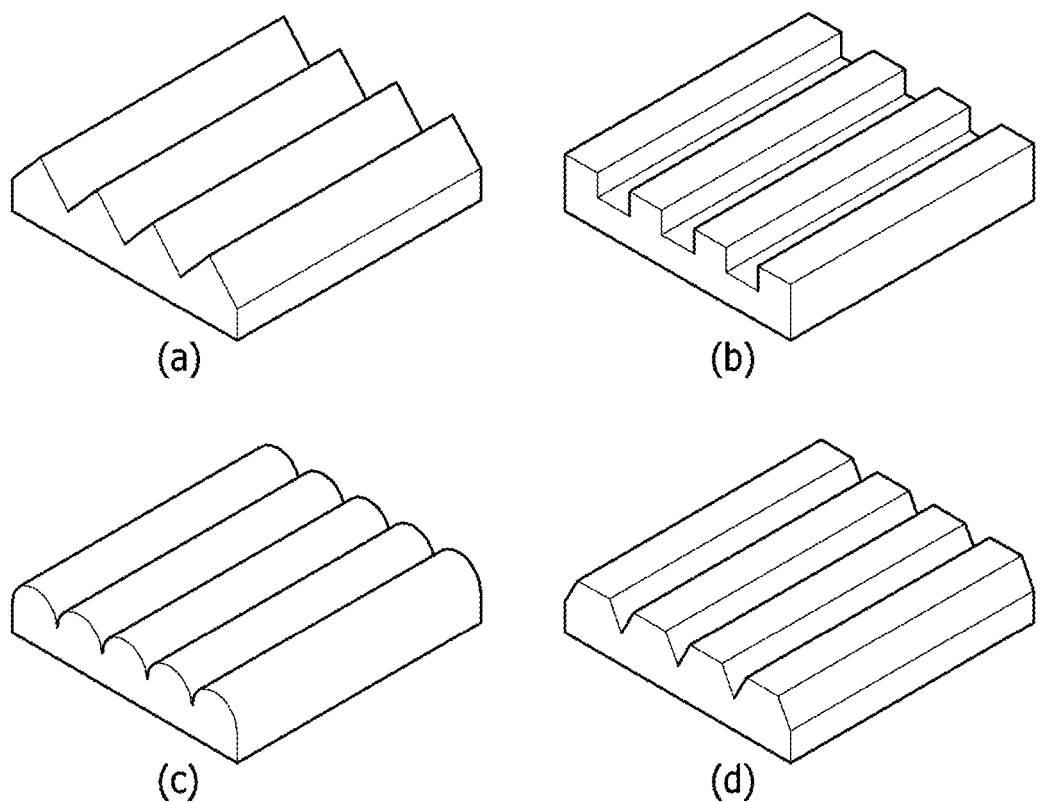
FIG. 4 is a schematic view illustrating a transfer base material according to a vertical cross-sectional shape of an uneven portion according to an exemplary embodiment of the present invention.

In this case, a vertical section of the uneven portions may have a polygonal shape or an arc shape with respect to the reverse image of the uneven portions transferred onto the molded ferrite sheet. The polygonal shape may include a triangular shape, a trapezoidal shape, and a quadrangular shape, and the arc shape may include a semicircular shape (see FIG. 4).

Referring to FIG. 1, when the transfer base material is the flat plate having the uneven portions on one surface thereof, the transfer base material may be brought into contact with an upper surface of the molded ferrite sheet, and then the molded ferrite sheet and the transfer base material may be pressed in a direction perpendicular thereto to form repeatedly uneven portions disposed in one direction on a surface of the molded ferrite sheet. Here, the flat plate having the uneven portions may be reused 20 times or more. When the flat plate is reused multiple times, the same effect can be obtained, thereby improving processing speed and economic efficiency. In addition, when uneven portions having the same shape are provided and repeatedly transferred, uneven portions having repeated patterns may be formed on the surface of the molded ferrite sheet.

Figure 2:
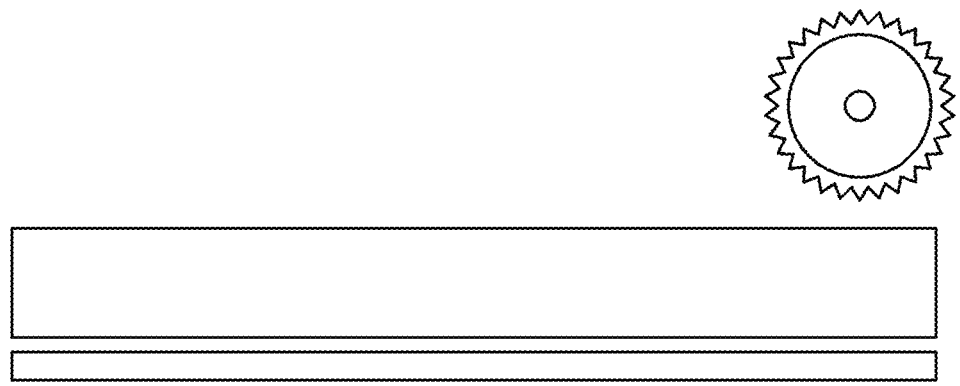
FIG. 2 is a schematic view illustrating a ferrite sheet manufacturing method using a roller having uneven portions on an outer surface thereof as a transfer base material according to an exemplary embodiment of the present invention.
Figure 3:
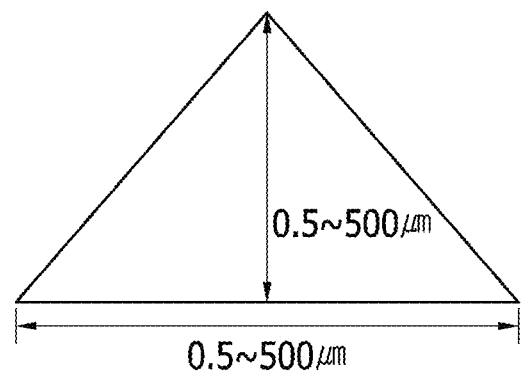
FIG. 3 is a vertical cross-sectional view illustrating an uneven portion according to an exemplary embodiment of the present invention.

In addition, referring to FIG. 2, when the transfer base material is the roller having the uneven portions on the outer surface thereof, the transfer base material may be brought into contact with the upper surface of the ferrite sheet, and then the roller may be rolled to form uneven portions on the surface of the molded ferrite sheet. In this case, the roller may have uneven portions on the outer surface thereof, which are composed of an optical film made of a thermosetting resin material.

Here, a width to height ratio of a cross section of each of the uneven portions formed through FIGS. 1 and 2 may be in a range of 1:0.2 to 1:1, and desirably in the range of 1:0.4 to 1:1. When the width to height ratio of each of the uneven portions is less than 1:0.2, a space formed due to the uneven portions may be narrow and may not sufficiently function as a gas passage. Accordingly, a gas generated during combustion of a binder may not be discharged to generate wrinkles or waviness of ferrite sheets, resulting in a reduction in sheet formability and product yield. When the width to height ratio of each of the uneven portions is greater than 1:1, the uneven portions may be difficult to form during a process. Even when the uneven portions are formed, the uneven portions may be easily damaged when ferrites are separated after being stacked and sintered, and process reliability may be lowered due to damaged foreign substances.

In addition, each of the uneven portions may have an average width of 0.5 μm to 500 μm and an average height of 0.5 μm to 100 μm, and desirably have an average width of 0.5 μm to 30 μm and an average height of 0.5 μm to 15 μm. Each of the uneven portions may more desirably have an average width of 2 μm to 20 μm and an average height of 0.5 μm to 10 μm. When the average width of each of the uneven portions is less than 0.5 μm, manufacturing process yield of ferrite sheets may be significantly lowered. When the average width is greater than 500 μm, there is little effect on uneven portion formation. Thus, when a large amount of ferrite sheets are stacked and sintered, the ferrite sheets are attached to one another and thus are difficult to separate. In addition, when the average height is less than 0.5 μm, the manufacturing process yield of ferrite sheets may be significantly lowered. When the average height is greater than 100 μm, the height of each of the uneven portions may be greater than a thickness of the ferrite sheets, thereby damaging the ferrite sheets.

In the ferrite sheet manufacturing method according to an exemplary embodiment of the present invention, the pressing may be performed at a pressure in a range of 10 Mpa to 100 Mpa, and desirably in the range of 30 Mpa to 80 Mpa. When the pressing is performed at a pressure less than 10 Mpa, uneven surface portions are not transferred onto the molded ferrite sheet or, despite being transferred, are insignificantly transferred, resulting in a reduction in an effect on the uneven portion formation. When the pressing is performed at a pressure greater than 100 Mpa, due to excessively strong pressure, the uneven surface portions are excessively transferred onto the molded ferrite sheet, thereby damaging the molded ferrite sheet.

Here, in an example, in operation (1-2), a carrier material may be further provided on a surface opposite to a pressurized surface of the molded ferrite sheet. For example, the molded ferrite sheet may be provided on an upper portion of the carrier material. The transfer base material may be manufactured by forming paper or a film into a rolled shape and the film may be coated with at least one polymer selected from the group consisting of polyethylene terephthalate (PET), polyimide (PI), polyethylene (PE), polypropylene (PP), and polycarbonate (PC). When the transfer base material moves on the same plane as the ferrite sheet to press and transfer uneven portions on a surface of the transfer base material onto the upper surface of the ferrite sheet, the transfer base material may be used as a tool for continuously transferring the ferrite sheet.

Next, operation (1-3) of stacking the plurality of molded ferrite sheets to prepare the ferrite stack is performed. Operation (1-3) is an operation of preparing the ferrite stack by stacking the plurality of molded ferrite sheets having gas discharge passages formed by forming the uneven portions in operation (1-2). In this case, since the gas discharge passages are disposed between the molded ferrite sheets, the binder combustion gas generated in the sintering process to be performed later can be efficiently discharged, thereby effectively preventing wrinkles and waviness of the ferrite sheets.

Next, operation (2) of sintering the stacked molded ferrite sheets is performed.

The sintering process may be performed at a temperature of 900° C. to 1,300° C. for about 1-5 hours and may be performed in an atmosphere such as an atmospheric environment or an atmosphere having oxygen partial pressure higher than that of the atmospheric environment. After a manufactured ferrite sheet is sintered, a sintered body may have, for example, a density of 5.0 g/cm$^3$ to 5.3 g/cm$^3$.

In addition, according to the present invention, in order to provide a passage of a gas generated during combustion of a binder, it is possible to implement a ferrite sheet having uneven portions formed on at least one surface thereof, of which a vertical section has a polygonal shape or an arc shape. The ferrite sheet according to the present invention may be manufactured according to the above-described manufacturing method. Since the ferrite sheet is the same as that described above, redundant descriptions thereof will be omitted.

Here, a width to height ratio of a cross section of each of the uneven portions may be in a range of 1:0.2 to 1:1, and desirably in the range of 1:0.4 to 1:1. When the width to height ratio of each of the uneven portions is less than 1:0.2, a space formed due to the uneven portions may be narrow and may not sufficiently function as a gas passage. When the width to height ratio of each of the uneven portions is greater than 1:1, the uneven portions may be difficult to form during a process, and ferrite sheets may be easily damaged during separation due to an excessive height of the uneven portions.

Each of the uneven portions may have an average width of 0.5 μm to 500 μm and an average height of 0.5 μm to 100 μm, and desirably have an average width of 0.5 μm to 30 μm and an average height of 0.5 μm to 15 μm. Each of the uneven portions may more desirably have an average width of 2 μm to 20 μm and an average height of 0.5 μm to 10 μm. When the average width of each of the uneven portions is less than 0.5 μm, the manufacturing process yield of ferrite sheets may be significantly lowered. When the average width of each of the uneven portions is greater than 500 μm, there is little effect on the uneven portion formation. Thus, when a large amount of ferrite sheets are stacked and sintered, the ferrite sheets are attached to one another and thus are difficult to separate. When the average height is less than 0.5 μm, the manufacturing process yield of ferrite sheets may be significantly lowered. When the average height is greater than 100 μm, the height of each of the uneven portions may be greater than a thickness of the ferrite sheets, thereby damaging the ferrite sheets.

In addition, the ferrite sheet may have an average roughness of 1 μm to 20 μm and more desirably have an average roughness of 1 μm to 10 μm. When the average roughness of the ferrite sheet is less than 1 μm, a contact area between a plurality of stacked ferrite sheets is relatively increased, and the plurality of stacked ferrite sheets may not be easy to separate after being sintered and thus may be damaged during separation, resulting in a yield reduction. Furthermore, when the average roughness of the ferrite sheet is greater than 20 μm, electrical characteristics according to surface roughness are rather lowered, resulting in a reduction in reliability of an electrical component using the ferrite sheet.

In addition, according to the present invention, it is possible to implement a transfer base material for manufacturing a ferrite sheet, the transfer base material having uneven portions including ridges and valleys which are alternately formed from one edge to an edge facing the one edge thereof and extend in a direction in which the other two edges face each other. The transfer base material may be composed of an optical film made of a thermosetting resin material and may be an optical film having uneven portions in a microunit on a surface thereof. A width to height ratio of a cross section of each of the uneven portions may be in a range of 1:0.2 to 1:1, an average width of each of the uneven portions may be in a range of 0.5 μm to 500 μm, and an average height of each of the uneven portions may be in a range of 0.5 μm to 100 μm.

EXAMPLES

Hereinafter, the present invention will be described in more detail through the following Examples. The following Examples are provided to illustrate the present invention and are not intended to limit the scope of the present invention.

Example 1: Preparation of Molded Ferrite Sheet

A molded ferrite sheet was prepared by applying a ferrite solution on an upper portion of a PET film and drying the ferrite solution. Subsequently, a molded ferrite sheet having gas discharge passages was prepared by bringing a thin film-type transfer base material into contact with an upper surface of the molded ferrite sheet and pressing the transfer base material, having repeatedly uneven portions which each may have a vertical section having a triangular shape, an average width of 10 μm, and an average height of 3 μm, and the molded ferrite sheet at a pressure of 38 Mpa to transfer uneven portions onto the molded ferrite sheet by using an isotropic pressure press.

Examples 2-4: Preparation of Molded Ferrite Sheet

Molded ferrite sheets were prepared in the same manner as in Example 1, except that transfer base materials having uneven portions of the same shape as in Table 1 were used in Example 1.

Comparative Examples 1-4: Preparation of Molded Ferrite Sheet

Molded ferrite sheets were prepared in the same manner as in Example 1, except that transfer base materials having uneven portions of the shame shape as in Table 1 were used in Example 1.

Experimental Example 1: Measurement of Separation Yield

The molded ferrite sheets prepared in Examples and Comparative Examples were manually separated from the transfer base material and were cut to a certain size. Then, 30 sheets were simultaneously stacked and sintered at a temperature of 1,000° C. for 3 hours, and separation yield was measured.

The separation yield was measured in such a manner that an appearance of a ferrite sheet was visually observed and the ferrite sheet was determined as being a defective product when defects such as cracks and holes were generated. When wrinkles were generated in an amount of 10% or more with respect to a width and a length of the ferrite sheet, the ferrite sheet was determined as being a defective product due to imperfect combustion of a binder gas. A final quantity of a ferrite sheet meeting a standard of high quality, rather than low quality, was measured and results of the measurement were shown in Table 1 and FIG. 5.

Separation yield (%)=Final quantity of ferrite sheet/
Initial input quantity of ferrite sheet×100   [Formula 1]

TABLE 1

| Classification | Transfer base material | | | | Ferrite Sheet | |
|---|---|---|---|---|---|---|
| | Cross-sectional shape of Transfer base material | Average width of Uneven portion ($\mu$m) | Average height of Uneven portion ($\mu$m) | Ratio of Width to Height of Uneven portion ($\mu$m) | Average roughness ($\mu$m) | Separation yield (%) |
| Example 1 | Triangular shape | 10 | 3 | 0.3 | 3 | 98.2 |
| Example 2 | Triangular shape | 10 | 5 | 0.5 | 5 | 99.4 |
| Example 3 | Triangular shape | 20 | 10 | 0.5 | 10 | 94.5 |
| Example 4 | Triangular shape | 5 | 1 | 0.2 | 1 | 91.2 |
| Comparative Example 1 | Triangular shape | 5 | 0.04 | 0.008 | 0.04 | 8.3 |
| Comparative Example 2 | Triangular shape | 5 | 0.35 | 0.07 | 0.35 | 22.0 |
| Comparative Example 3 | | Irregular | | | 1.51 | 67.3 |
| Comparative Example 4 | | Irregular | | | 2.73 | 69.8 |

Figure 5:
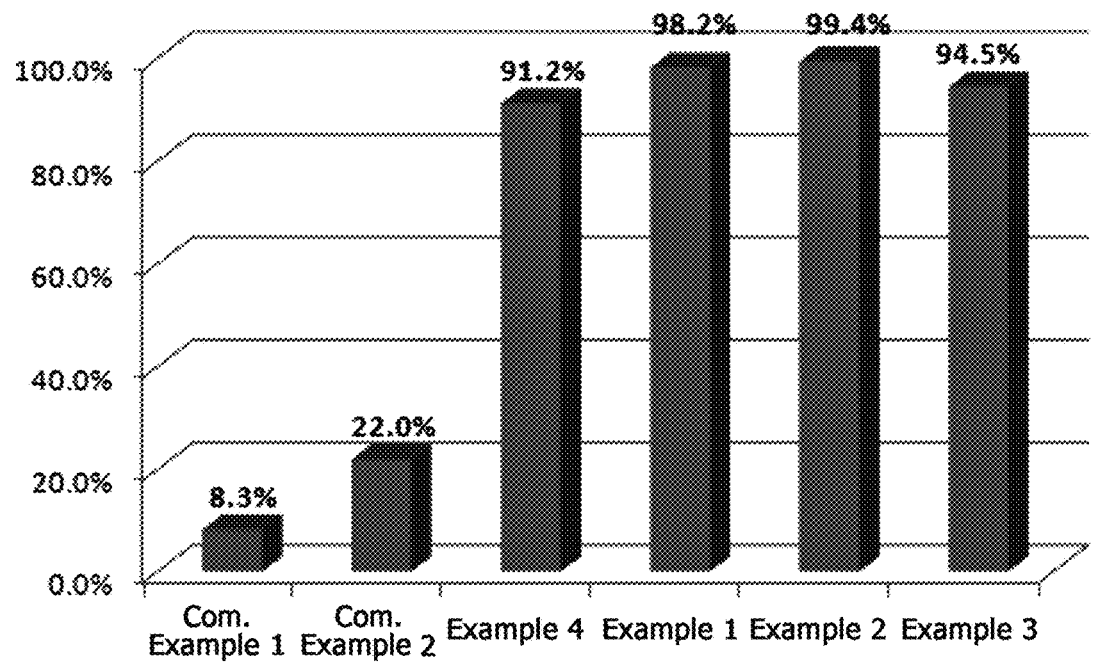
FIG. 5 is a graph showing a manufacturing yield of a ferrite sheet according to a size of an uneven portion according to an exemplary embodiment of the present invention.

Referring to Table 1 and FIG. 5, in the case of Examples 1 to 4 in which a height, a width, and a width to height ratio of an uneven portion of a molded ferrite sheet are included in a numerical range of the present invention, it can be seen that separation yield is considerably high.

Figure 10A:
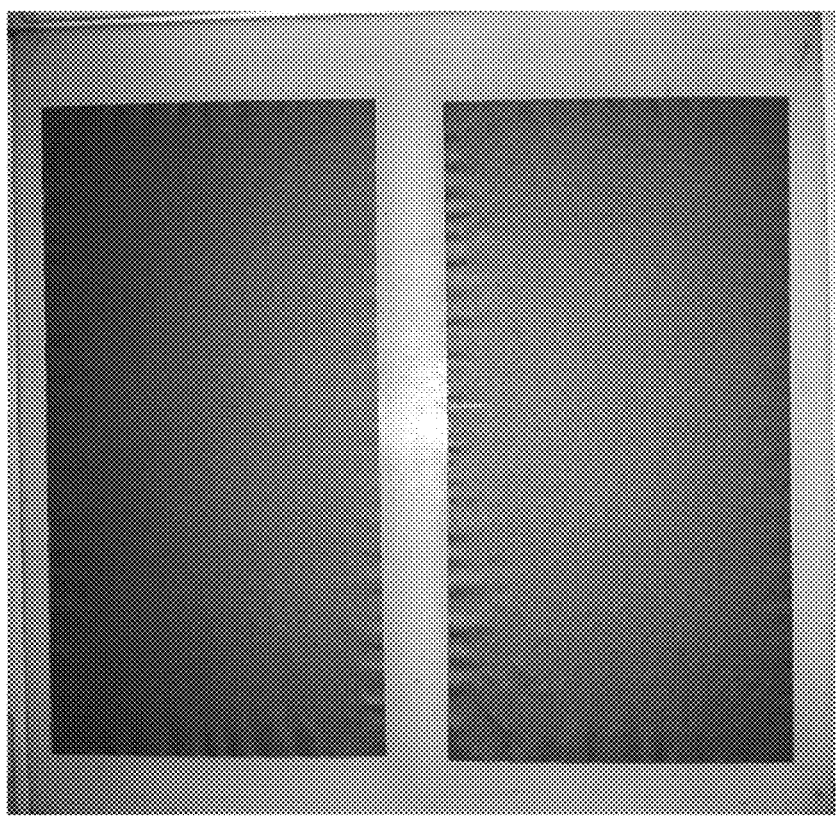
FIGS. 10A and 10B show images of ferrite sheets.
Figure 10B:
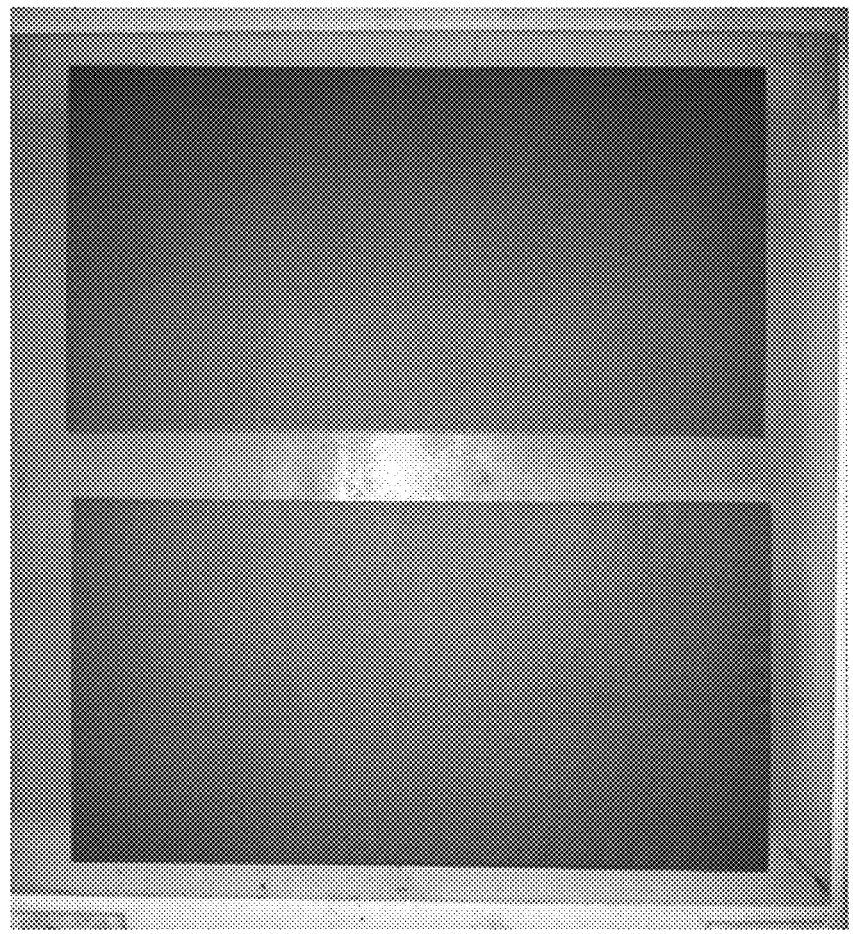

To the contrary, in the case of Comparative Examples 1 and 2 in which a height, a width, and a width to height ratio of an uneven portion of a molded ferrite sheet have values outside of the numerical range of the present invention, it can be seen that separation yield is considerably lowered. Referring to FIGS. 10A and 10B, in comparison with FIG. 10B corresponding to Example 1, in the case of FIG. 10A corresponding to Comparative Example 1, fine wrinkles are generated to be considerably visible to the naked eye, it can be confirmed that a binder combustion gas is not smoothly discharged in a sintering process and remains as wrinkles in a ferrite stack, and thus a ratio of high quality is determined as being only 8.3%.

Figure 11A:
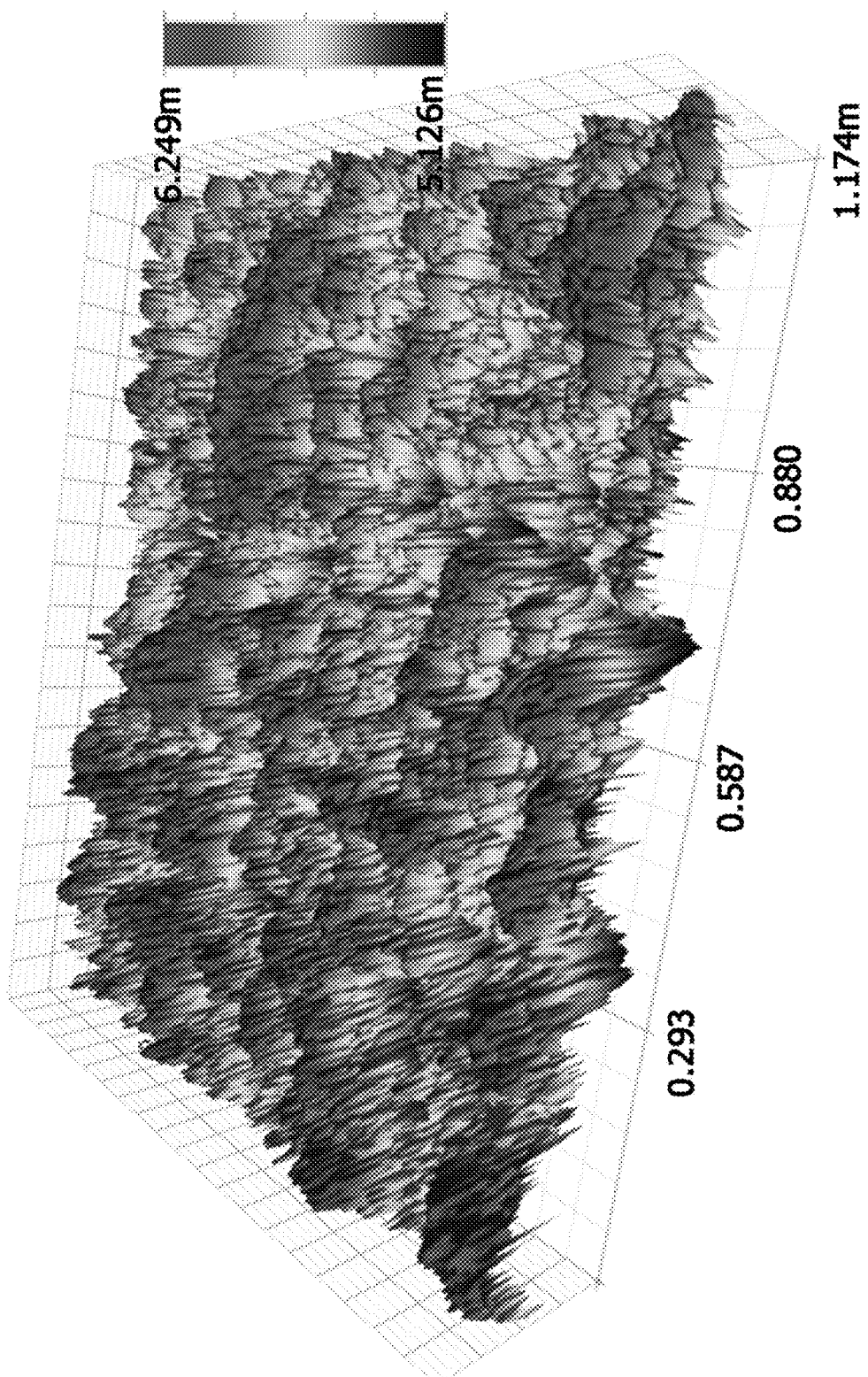
FIGS. 11A and 11B show graphs of optical microscope analyses of ferrite sheets.
Figure 11B:
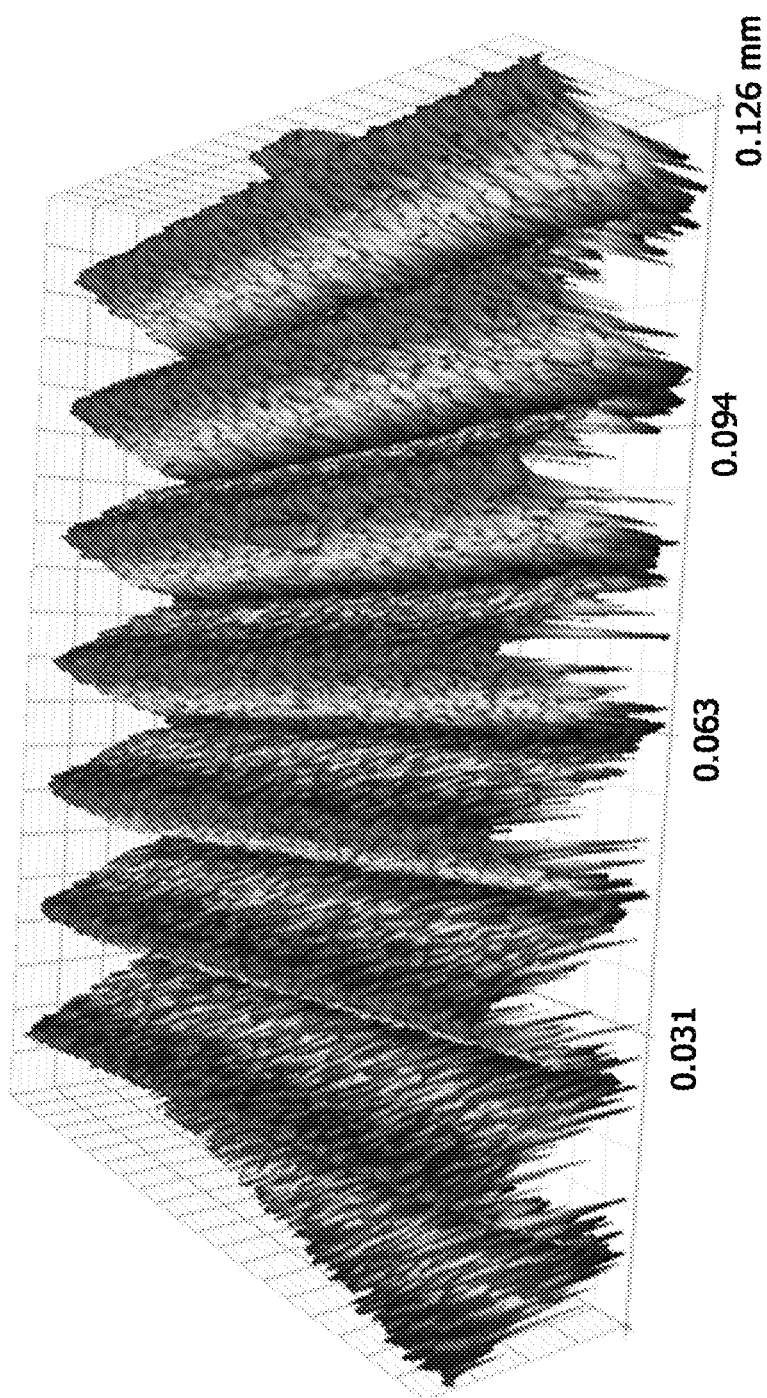

In the case of Comparative Examples 3 and 4 prepared using a transfer base material having uneven portions in an irregular shape, although Comparative Examples 3 and 4 meet an average roughness range of the present invention, it can be seen that separation yield is considerably lowered. That is, as shown in FIGS. 11A and 11B, it can be seen that sheets are damaged due to an irregular surface shape of ferrite sheets during separation or a binder combustion gas is not smoothly discharged.

As a result, when ferrite sheets are prepared using a transfer base material in which uneven portions have a shape having a width, a height, and a width to height ratio according to the numerical range of the present invention, it can be seen that the ferrite sheets are easy to separate.

Although ferrite sheets have average roughness according to the present invention, when a shape of uneven portions does not meet the numerical range of the present invention, it can be seen that a desired yield is not obtained.

Examples 5 to 8: Preparation of Molded Ferrite Sheet

Molded ferrite sheets were prepared in the same manner as in Example 1, except that the number of reuse of transfer base material of Example 1 was as shown in Table 2.

Figure 6:
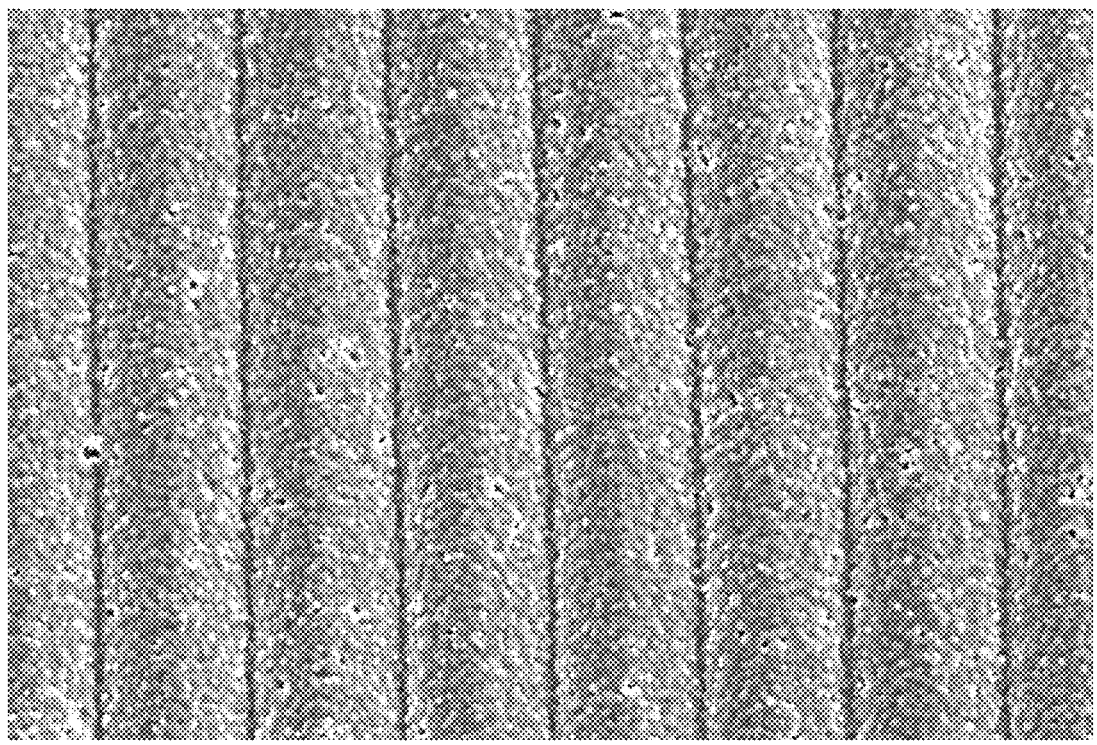
FIG. 6 shows a scanning electron microscope (SEM) image of an upper surface of a ferrite sheet having uneven portions according to an exemplary embodiment of the present invention.
Figure 7:
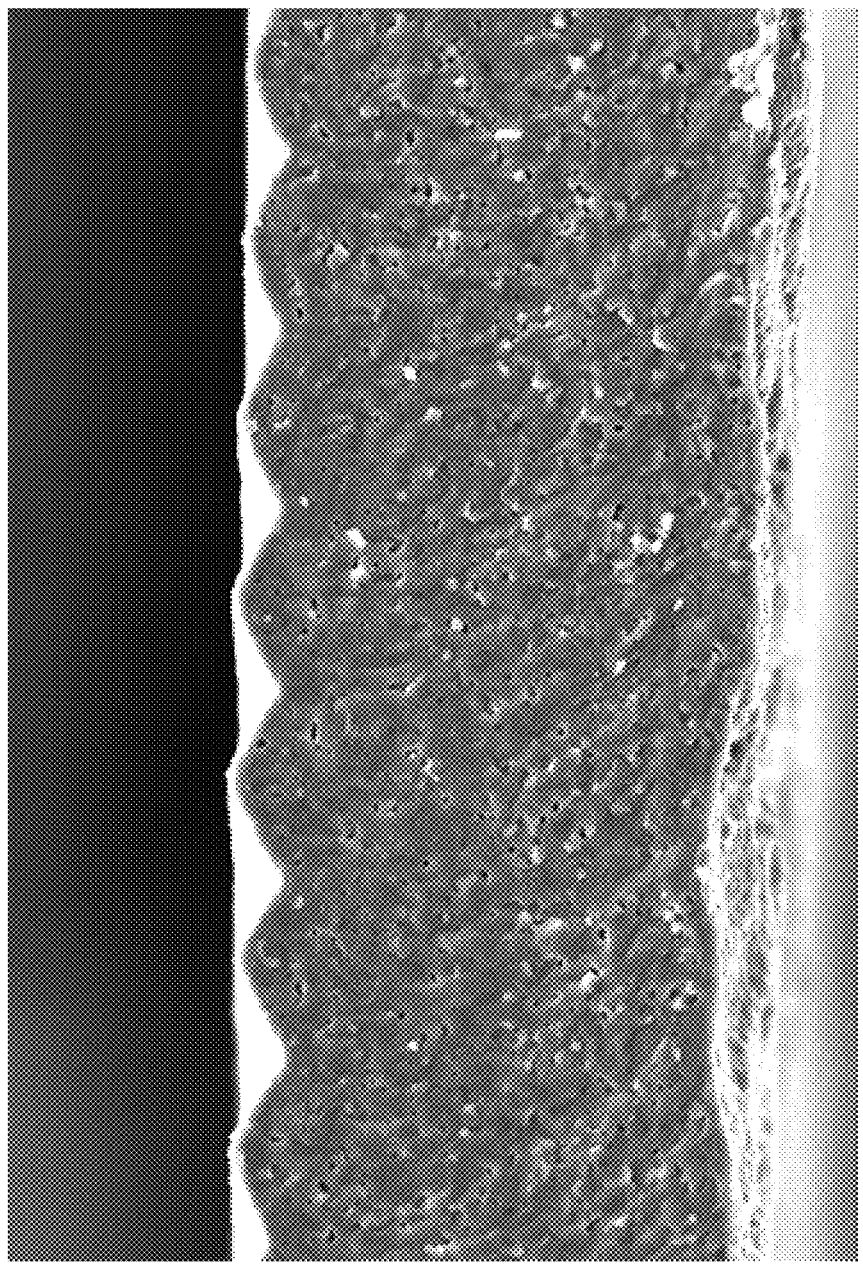
FIG. 7 shows a SEM image of a cross section of a ferrite sheet having the uneven portions according to the exemplary embodiment.
Figure 8:
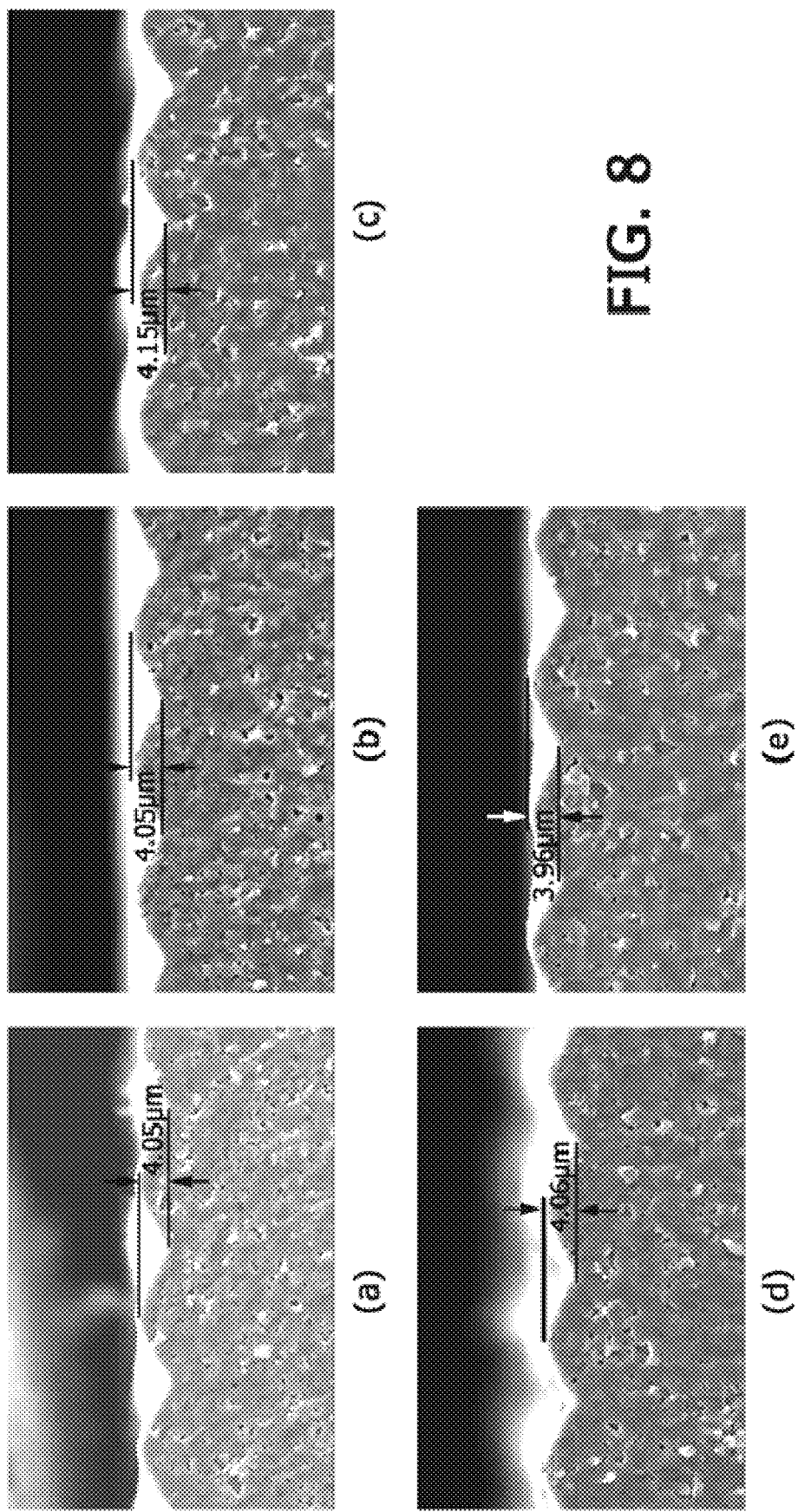
FIG. 8 shows images of a cross section of a ferrite sheet according to reuse of a transfer base material according to an exemplary embodiment of the present invention.

Experimental Example 2: Fine Structure Observation of Uneven Portions Provided in Ferrite Sheet Fine structures of the molded ferrite sheets prepared in Examples 1 and 5 to 8 were observed with a scanning electron microscope (SEM), and observation results were shown in FIGS. 6 to 8. In this case, FIG. 6 shows a SEM image of an upper surface of the molded ferrite sheet of Example 1, and FIG. 7 shows a SEM image of a vertical section of a ferrite sheet of Example 1. FIG. 8 shows images of a cross section of each of uneven portions of a molded ferrite sheet according to a number of reuse of a transfer base material. In addition, a size of uneven portions according to the number of reuse was shown in Table 2.

TABLE 2

| Classification | Number of reuse of Transfer base material | Width of Uneven portion ($\mu$m) |
|---|---|---|
| Example 1 (FIG. 8 (a)) | Once | 4.05 |
| Example 5 (FIG. 8 (b)) | 5 times | 4.05 |
| Example 6 (FIG. 8 (c)) | 10 times | 4.15 |
| Example 7 (FIG. 8 (d)) | 15 times | 4.06 |
| Example 8 (FIG. 8 (e)) | 20 times | 3.96 |

Referring to Table 2 and FIG. 8, even when the transfer base material according to the present invention is reused multiple times, it can be confirmed that an influence on a size of a formed uneven portion is small, and even when the transfer base material according to the present invention is reused 20 times, it can be confirmed that a change in the size is still small.

The invention claimed is:

1. A ferrite sheet comprising uneven portions on at least one surface thereof so as to provide gas discharge passages, the at least one surface having a first edge, a second edge opposite the first edge, a third edge, and a fourth edge opposite the third edge, the uneven portions having triangular-shaped ridges and valleys that are alternatively formed from the first edge to the second edge, and each ridge and valley are continuous from the third edge to the fourth edge, the uneven portions each having a vertical section having a triangular shape when viewed from the third edge or when viewed from the fourth edge, wherein a width to height ratio of a cross section of each of the uneven portions is in a range of 1:0.2 to 1:1, an average width of each of the uneven portions is in a range of 0.5 µm to 500 µm, and an average height of each of the uneven portions is in a range of 0.5 µm to 100 µm.

2. The ferrite sheet of claim 1, wherein the ferrite sheet has an average roughness of 0.8 µm to 20 µm.

3. The ferrite sheet of claim 1, wherein the ferrite sheet is sintered to a second ferrite sheet such that the gas discharge passages are formed between the ferrite sheet and the second ferrite sheet.

* * * * *